United States Patent
Li et al.

(10) Patent No.: US 10,305,183 B2
(45) Date of Patent: May 28, 2019

(54) ACTIVE ANTENNA ASSOCIATED DEVICE AND SYSTEM, AND TRANSMITTING AND RECEIVING CALIBRATION METHOD

(71) Applicant: China Academy of Telecommunications Technology, Beijing (CN)

(72) Inventors: Chuanjun Li, Beijing (CN); Xin Su, Beijing (CN)

(73) Assignee: China Academy of Telecommunications Technology, Beijing (CN)

( * ) Notice: Subject to any disclaimer, the term of this patent is extended or adjusted under 35 U.S.C. 154(b) by 251 days.

(21) Appl. No.: 15/310,702

(22) PCT Filed: May 14, 2015

(86) PCT No.: PCT/CN2015/078979
§ 371 (c)(1),
(2) Date: Nov. 11, 2016

(87) PCT Pub. No.: WO2015/172730
PCT Pub. Date: Nov. 19, 2015

(65) Prior Publication Data
US 2017/0077602 A1    Mar. 16, 2017

(30) Foreign Application Priority Data
May 14, 2014    (CN) .......................... 2014 1 0204038

(51) Int. Cl.
*H01Q 1/24*    (2006.01)
*H01Q 5/22*    (2015.01)
(Continued)

(52) U.S. Cl.
CPC ................. *H01Q 5/22* (2015.01); *H01Q 1/24* (2013.01); *H01Q 9/065* (2013.01); *H04B 1/10* (2013.01);
(Continued)

(58) Field of Classification Search
CPC ... H04B 1/10; H04B 1/38; H04B 1/40; H04B 7/0617; H04B 10/11431; H04B 10/2503;
(Continued)

(56) References Cited

U.S. PATENT DOCUMENTS 6,075,997 A *   6/2000   Lindqvist .............. H04W 24/00
                                                                    343/722
8,320,903 B2    11/2012   Ding et al.
(Continued)

FOREIGN PATENT DOCUMENTS

| CN | 101383647 | 3/2009 |
|---|---|---|
| CN | 102035611 | 4/2011 |

(Continued)

OTHER PUBLICATIONS

International Search Report for PCT/CN2015/078979 dated Aug. 17, 2015.

*Primary Examiner* — Young T Tse
(74) *Attorney, Agent, or Firm* — Foley & Lardner LLP

(57) ABSTRACT

An active antenna associated device and system, and a transmitting and receiving calibration method, used for implementing extensible design of an antenna array, reducing construction implementation difficulty, and ensuring construction implementation reliability. The active antenna unit comprises: N active antenna arrays, a main calibration coupling circuit unit, a transmitting and receiving calibrating unit, a calibration parameter storage unit, and a radio over fiber (ROF) photoelectric conversion unit, wherein N is larger than 1. Each active antenna array at least comprises an (Continued)

antenna calibration coupling circuit unit and M antenna oscillators connected to the antenna calibration coupling circuit unit, wherein M is larger than 1. The antenna calibration coupling circuit units of the active antenna arrays are connected to the main calibration coupling circuit unit through a calibration radio frequency channel. The main calibration coupling circuit is connected with the transmitting and receiving calibrating unit. The transmitting and receiving calibrating unit and the calibration parameter storage unit are respectively connected to the ROF photoelectric conversion unit.

15 Claims, 7 Drawing Sheets

(51) Int. Cl.
*H01Q 9/06* (2006.01)
*H04B 17/11* (2015.01)
*H04B 1/10* (2006.01)
H04B 7/06 (2006.01)
H04B 1/04 (2006.01)

(52) U.S. Cl.
CPC ............ *H04B 17/11* (2015.01); *H04B 7/0617* (2013.01); *H04B 2001/0408* (2013.01)

(58) Field of Classification Search
CPC ............ H04B 17/11–17/13; H04B 2001/0408; H01Q 1/24; H01Q 5/22; H01Q 9/065

USPC ....... 375/210, 220, 222, 259, 260, 262, 265, 375/267, 268, 271; 370/328, 329, 334, 370/339, 341; 398/128, 130; 455/39, 42, 455/500, 73, 88

See application file for complete search history.

(56) References Cited

U.S. PATENT DOCUMENTS

| | | | |
|---|---|---|---|
| 2006/0111071 A1* | 5/2006 | Paulus | H04B 1/30 455/302 |
| 2007/0019679 A1* | 1/2007 | Scheck | H04W 88/085 370/480 |
| 2008/0260388 A1* | 10/2008 | Kim | H04B 10/25753 398/115 |
| 2009/0066595 A1* | 3/2009 | Barker | H01Q 1/246 343/757 |
| 2010/0321233 A1 | 12/2010 | Ben-Zur et al. | |
| 2011/0134972 A1* | 6/2011 | Zhu | H01Q 1/246 375/219 |
| 2012/0014697 A1* | 1/2012 | Zhao | H01Q 1/246 398/115 |
| 2013/0260844 A1 | 10/2013 | Rucki et al. | |

FOREIGN PATENT DOCUMENTS

| | | |
|---|---|---|
| CN | 103053072 | 4/2013 |
| CN | 203387519 U | 1/2014 |
| CN | 103997352 | 8/2014 |
| EP | 2 299 774 A1 | 3/2011 |
| WO | WO-2005/002070 | 2/2006 |

* cited by examiner

ACTIVE ANTENNA ASSOCIATED DEVICE AND SYSTEM, AND TRANSMITTING AND RECEIVING CALIBRATION METHOD

This application is a US National Stage of International Application No. PCT/CN2015/078979, filed on 14 May 2015, designating the United States, and claiming the benefit of Chinese Patent Application No. 201410204038.0, filed with the Chinese Patent Office on May 14, 2014 and entitled "Active antenna related devices, a system, and a transmission and reception calibrating method", each of which is hereby incorporated by reference in its entirety.

FIELD

The present invention relates to the field of communications, and particularly to active antenna related devices, a system, and a transmission and reception calibrating method.

BACKGROUND

At present, a communication system architecture including Baseband building Units (BBUs) and Remote Radio Units (RRUs) is deployed in a Third-Generation (3G) mobile communication network, where the BBUs are connected with the RRUs over optic fibers, and one BBU can support a number of RRUs.

FIG. 1 illustrates a schematic architectural diagram of a communication system including BBUs and RRUs, where a BBU is connected with an optical interface of an RRU over an optic fiber, the optical interface in the RRU is connected with a digital intermediate-frequency component, and the digital intermediate-frequency component is connected respectively with an array of transceivers, and a transmission and reception calibrating unit. Here the transceivers are connected with an array of Power Amplifiers (PAs) and Low Noise Amplifiers (LNAs), the array of PAs and LNAs is connected with an array of passive antenna, and the transmission and reception calibrating unit is connected with the array of passive antennas over a calibration radio frequency channel. As can be apparent, the RRU is connected with the passive antennas through (N+1) radio frequency jump-up lines, the number of which increases with the increasing number N of antenna radio frequency channels.

In a massive Multiple-Input Multiple-Output (MIMO) communication system, the number N of antenna radio frequency channels is more than or equal to 64, that is, the number of radio frequency jump-up lines is more than 64, and in order to alleviate a transmission loss between the antennas and the RRU, the jump-up lines are typically radio frequency cables with certain diameter, but it is rather difficult to engineer a large number of radio frequency cables, and to guarantee the reliability thereof.

Accordingly the existing solution to the communication system including the BBUs and the RRUs together with the passive antennas is not feasible in the massive MIMO communication system.

SUMMARY

Embodiments of the invention provide active antenna related devices, a system, and a transmission and reception calibrating method so as to carry out an extensible design of an array of antennas to thereby make it less difficult to engineer the array of antennas while guaranteeing the implementation reliability thereof.

Particular technical solutions according to embodiments of the invention are as follows:

In a first aspect, an embodiment of the invention provides an active antenna device including:

N arrays of active antennas, a primary calibration coupling circuit unit, a transmission and reception calibrating unit, a calibration parameter storage unit, a Radio Over Fiber (ROF) photoelectric converting unit, wherein N is more than 1;

each of the arrays of active antennas includes at least an antenna calibration coupling circuit unit, and M antenna dipoles connected with the antenna calibration coupling circuit unit, wherein M is more than 1;

the antenna calibration coupling circuit units of the arrays of active antennas are connected with the primary calibration coupling circuit unit over a calibration radio frequency channel, the primary calibration coupling circuit unit is connected with the transmission and reception calibrating unit, and the transmission and reception calibrating unit and the calibration parameter storage unit are connected respectively with the ROF photoelectric converting unit;

the calibration parameter storage unit stores transmission parameters of the calibration radio frequency channel of the N arrays of active antennas, and transmits the transmission parameters to the ROF photoelectric converting unit, so that the ROF photoelectric converting unit converts the transmission parameters into an optical signal, and transmits the transmission parameters over an optic fiber; and the antenna calibration coupling circuit unit of each array of active arrays couples received M calibration radio frequency signals into one transmission calibration radio frequency signal, and outputs the one transmission calibration radio frequency signal to the primary calibration coupling circuit unit over the calibration radio frequency channel; the primary calibration coupling circuit unit merges the N transmission calibration radio frequency signals transmitted by the N arrays of active arrays into one transmission calibration radio frequency signal; the transmission and reception calibrating unit amplifies the power of the one transmission calibration radio frequency signal transmitted by the primary calibration coupling circuit unit, and then demodulates the one transmission calibration radio frequency signal into a transmission calibration IQ analog signal, and outputs the transmission calibration IQ analog signal to the ROF photoelectric converting unit; and the ROF photoelectric converting unit converts the transmission calibration IQ analog signal into an optical signal, and transmits the optical signal over the optic fiber; and/or the transmission and reception calibrating unit modulates a reception calibration IQ analog signal transmitted by the ROF photoelectric converting unit into a reception calibration radio frequency signal, amplifies the power of the reception calibration radio frequency signal, and then transmits the power-amplified reception calibration radio frequency signal to the primary calibration coupling circuit unit; the primary calibration coupling circuit unit splits the power-amplified reception calibration radio frequency signal into N duplicate reception calibration radio frequency signals, and transmits the N duplicate reception calibration radio frequency signals to the corresponding antenna calibration coupling circuit units respectively over the calibration radio frequency channel corresponding to the N arrays of active antennas; and each antenna calibration coupling circuit unit splits the received one reception calibration radio frequency signal into M reception calibration radio frequency signals.

In a second aspect, an embodiment of the invention provides an active antenna device including:

N arrays of active antennas, a primary calibration coupling circuit unit, a transmission and reception calibrating unit, a calibration parameter storage unit, a digital processing unit, and an optic fiber interface unit, wherein N is more than 1;

each of the arrays of active antennas includes at least an antenna calibration coupling circuit unit, and M antenna dipoles connected with the antenna calibration coupling circuit unit, wherein M is more than 1;

the antenna calibration coupling circuit units of the arrays of active antennas are connected with the primary calibration coupling circuit unit over a calibration radio frequency channel, the primary calibration coupling circuit unit is connected with the transmission and reception calibrating unit, and the transmission and reception calibrating unit and the calibration parameter storage unit are connected respectively with the digital processing unit;

the calibration parameter storage unit stores transmission parameters of the calibration radio frequency channel of the N arrays of active antennas, and transmits the transmission parameters to the digital processing unit; and the antenna calibration coupling circuit unit of each array of active arrays couples received M calibration radio frequency signals into one transmission calibration radio frequency signal, and outputs the one transmission calibration radio frequency signal to the primary calibration coupling circuit unit over the calibration radio frequency channel; the primary calibration coupling circuit unit merges the N transmission calibration radio frequency signals transmitted by the N arrays of active arrays into one transmission calibration radio frequency signal; the transmission and reception calibrating unit amplifies the power of the one transmission calibration radio frequency signal transmitted by the primary calibration coupling circuit unit, and then demodulates the one transmission calibration radio frequency signal into a transmission calibration IQ analog signal, and outputs the transmission calibration IQ analog signal to the digital processing unit; and the digital processing unit converts the transmission calibration IQ analog signal into a transmission calibration IQ digital signal, and transmits the transmission calibration IQ digital signal through the optic fiber interface unit; and/or the digital processing unit converts a reception calibration IQ digital signal received by the optic fiber interface unit into a reception calibration IQ analog signal; the transmission and reception calibrating unit modulates the reception calibration IQ analog signal transmitted by the digital processing unit into a reception calibration radio frequency signal, amplifies the power of the reception calibration radio frequency signal, and then transmits the power-amplified reception calibration radio frequency signal to the primary calibration coupling circuit unit; the primary calibration coupling circuit unit splits the power-amplified reception calibration radio frequency signal into N duplicate reception calibration radio frequency signals, and transmits the N duplicate reception calibration radio frequency signals to the corresponding antenna calibration coupling circuit units respectively over the calibration radio frequency channel corresponding to the N arrays of active antennas; and each antenna calibration coupling circuit unit splits the received one reception calibration radio frequency signal into M reception calibration radio frequency signals.

In a third aspect, an embodiment of the invention provides a baseband building device including:

a Radio Over Fiber (ROF) photoelectric converting unit, a digital processing unit, and a baseband processing unit, which are connected sequentially, wherein:

the baseband processing unit converts one preset reception calibration sequence into one reception calibration IQ digital signal, and transmits the one reception calibration IQ digital signal to the digital processing unit; and receives N*M reception calibration IQ digital signals, revises the N*M reception calibration IQ digital signals using N*M preset transmission parameters of calibration radio frequency channels, and calculates reception calibration amplitude revision parameters and reception calibration phase revision parameters corresponding to respective radio frequency channels corresponding to the calibration radio frequency channels according to the revised N*M reception calibration IQ digital signals, and the reception calibration sequence; and/or the baseband processing unit converts N*M preset transmission calibration sequences into N*M transmission calibration IQ digital signals, revises the N*M transmission calibration IQ digital signals of the corresponding calibration radio frequency channels using the N*M preset transmission parameters of the calibration radio frequency channels, and transmits the revised N*M transmission calibration IQ digital signals to the digital processing unit, and the digital processing unit converts the revised N*M transmission calibration IQ digital signals into N*M transmission calibration IQ analog signals, and then the ROF photoelectric converting unit converts the N*M transmission calibration IQ analog signals into an optical signal, and transmits the optical signal over the optic fiber; and the baseband processing unit receives one transmission calibration IQ digital signal, and calculates transmission calibration amplitude revision parameters and transmission calibration phase revision parameters of the respective radio channels corresponding to the calibration radio frequency channels according to the received one transmission calibration IQ digital signal, and the N*M transmission calibration sequences;

the received N*M reception calibration IQ digital signals are obtained as a result of the one reception calibration IQ digital signal being transmitted over the one calibration radio frequency channel and the N*M radio frequency channels of the active antenna unit in that order, and then received over the optic fiber, and processed by the ROF photoelectric converting unit and the digital processing unit;

the received one transmission calibration IQ digital signal is obtained as a result of the revised N*M transmission calibration IQ digital signals being transmitted over the N*M radio frequency channels and the one calibration radio frequency channel of the active antenna device in that order, and then received over the optic fiber, and processed by the ROF photoelectric converting unit and the digital processing unit; and the N*M preset transmission parameters of the calibration radio frequency channels are received over the optic fiber, and then transmitted by the ROF photoelectric converting unit and the digital processing unit to the baseband processing unit.

In a fourth aspect, an embodiment of the invention provides a baseband building device including an optic fiber interface unit and a baseband processing unit, both of which are connected with each other, wherein:

the baseband processing unit converts one preset reception calibration sequence into one reception calibration IQ digital signal, and transmits the one reception calibration IQ digital signal to the optic fiber interface unit, and the optic fiber interface unit transmits the one reception calibration IQ digital signal over the optic fiber; and the baseband processing unit receives N*M reception calibration IQ digital signals transmitted by the optic fiber interface unit, revises the N*M reception calibration IQ digital signals using N*M preset transmission parameters of calibration radio frequency channels, and calculates reception calibration amplitude revision parameters and reception calibration phase revision parameters corresponding to respective radio frequency channels corresponding to the calibration radio frequency channels according to the revised N*M reception calibration IQ digital signals, and the reception calibration sequence; and/or the baseband processing unit converts N*M preset transmission calibration sequences into N*M transmission calibration IQ digital signals, revises the N*M transmission calibration IQ digital signals of the corresponding calibration radio frequency channels using the N*M preset transmission parameters of the calibration radio frequency channels, and transmits the revised N*M transmission calibration IQ digital signals to the optic fiber interface unit, and the optic fiber interface unit converts the revised N*M transmission calibration IQ digital signals into an optical signal, and transmits the optical signal over the optic fiber; and the baseband processing unit receives one transmission calibration IQ digital signal transmitted by the optic fiber interface unit, and calculates transmission calibration amplitude revision parameters and transmission calibration phase revision parameters of the respective radio frequency channels corresponding to the calibration radio frequency channels according to the received one transmission calibration IQ digital signal, and the N*M preset transmission calibration sequences;

wherein the received N*M reception calibration IQ digital signals are obtained as a result of the one reception calibration IQ digital signal being transmitted over the one calibration radio frequency channel and the N*M radio frequency channels of the active antenna unit in that order, and then received over the optic fiber, and processed by the optic fiber interface unit;

wherein the received one transmission calibration IQ digital signal is obtained as a result of the revised N*M transmission calibration IQ digital signals being transmitted over the N*M radio frequency channels and the one calibration radio frequency channel of the active antenna device in that order, and then received over the optic fiber, and processed by the optic fiber interface unit; and wherein the N*M preset transmission parameters of the calibration radio frequency channels are received over the optic fiber, and then transmitted by the optic fiber interface unit to the baseband processing unit.

In a fifth aspect, an embodiment of the invention provides a communication system including the active antenna device according to the first aspect, and the baseband building unit device according to the third aspect, wherein the active antenna device and the baseband building unit are connected over an optic fiber.

In a sixth aspect, an embodiment of the invention provides a communication system including the active antenna device according to the second aspect, and the baseband building device according to the fourth aspect, wherein the active antenna device and the baseband building device are connected over an optic fiber.

In a seventh aspect, an embodiment of the invention provides a transmission and reception calibrating method including:

converting, by a baseband building device, one preset reception calibration sequence into one reception calibration IQ digital signal, and transmitting the one reception calibration IQ digital signal to an active antenna device, and transmitting, by the active antenna device, the one reception calibration IQ digital signal over one calibration radio frequency channel and N*M radio frequency channels in that order, and then obtaining N*M reception calibration IQ digital signals; and receiving, by the baseband building device, the N*M reception calibration IQ digital signals, revising the N*M reception calibration IQ digital signals using N*M preset transmission parameters of the calibration radio frequency channels, and calculating reception calibration amplitude revision parameters and reception calibration phase revision parameters corresponding to the respective radio frequency channels corresponding to the calibration radio frequency channel according to the revised N*M reception calibration IQ digital signals, and the reception calibration sequence;

and/or converting, by the baseband building unit, N*M preset transmission calibration sequences into N*M transmission calibration IQ digital signals, revising the N*M transmission calibration IQ digital signals of the corresponding calibration radio frequency channel using the N*M preset transmission parameters of the calibration radio frequency channels, and transmitting the revised N*M transmission calibration IQ digital signals to the active antenna device, and transmitting, by the active antenna device, the revised N*M transmission calibration IQ digital signals over N*M radio frequency channels and the one calibration radio frequency channel in that order, and then obtaining one transmission calibration IQ digital signal; and receiving, by the baseband building device, the one transmission calibration IQ digital signal, and calculating transmission calibration amplitude revision parameters and transmission calibration phase revision parameters of the respective radio channels corresponding to the calibration radio frequency channel according to the received one transmission calibration IQ digital signal, and the N*M transmission calibration sequences.

With the technical solutions above, in the embodiments of the invention, the antenna calibration coupling circuit unit, the calibration radio frequency channel, the primary calibration coupling circuit unit, the transmission and reception calibrating unit, and the calibration parameter storing unit are additionally arranged in the active antenna unit to thereby provide a hardware support for transmission and reception calibration, so that transmission and reception calibration on the respective radio frequency channels can be performed using the active antenna device including the calibration radio frequency channel and the calibration circuit, and the extensible design of the antenna radio frequency channels can be carried out using the active antenna unit while guaranteeing uniform performance of the respective antenna radio frequency channels to thereby make it less difficult to engineer the array of antennas while guaranteeing the implementation reliability thereof.

BRIEF DESCRIPTION OF THE DRAWINGS

In order to make the technical solutions according to the embodiments of the invention more apparent, the drawings to which a description of the embodiments art refers will be briefly introduced below, and apparently the drawings to be described below are merely illustrative of some of the embodiments of the invention, and those ordinarily skilled in the art can derive from these drawings other drawings without any inventive effort. In the drawings.

DETAILED DESCRIPTION OF THE EMBODIMENTS

In order to make the objects, technical solutions, and advantages of the invention more apparent, the invention will be described below in further details with reference to the drawings, and apparently the embodiments described below are only a part but not all of the embodiments of the invention. Based upon the embodiments here of the invention, all the other embodiments which can occur to those skilled in the art without any inventive effort shall fall into the scope of the invention.

For a massive active antenna system with N more than or equal to 64, if N radio frequency channels are not uniform, then N uplink signals or downlink signals may not be merged for optimum performance, so it will be crucial to calibrate the N radio frequency channels.

Also for the massive active antenna system with N more than or equal to 64, it will be also crucial to extend flexibly the system to a massive active antenna system with N being 128 or 256.

There is a tradeoff between the extensibility of the system, and the calibration consistency between the N antennas because the N antennas need to be calibrated by coupling N signals into one signal, and the extensibility of the system needs to take into account the structures of respective sub-arrays.

Figure 1:
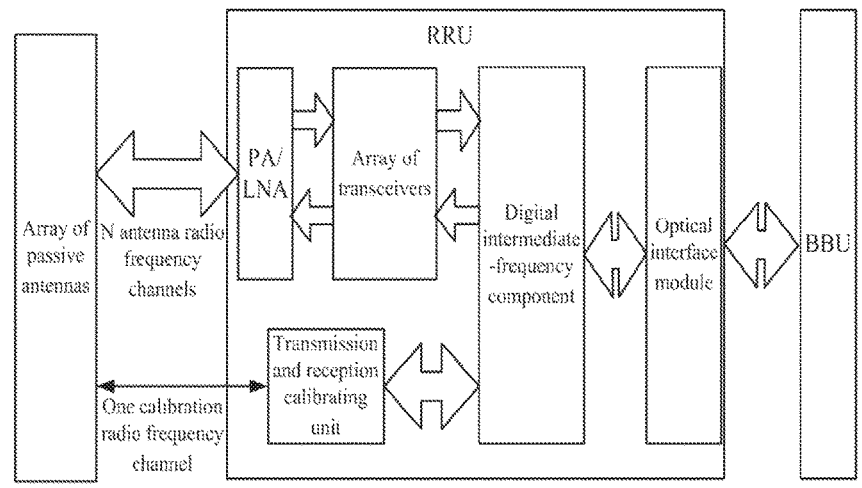
FIG. 1 is a schematic architectural diagram of a distributed communication system in the prior art.
Figure 2:
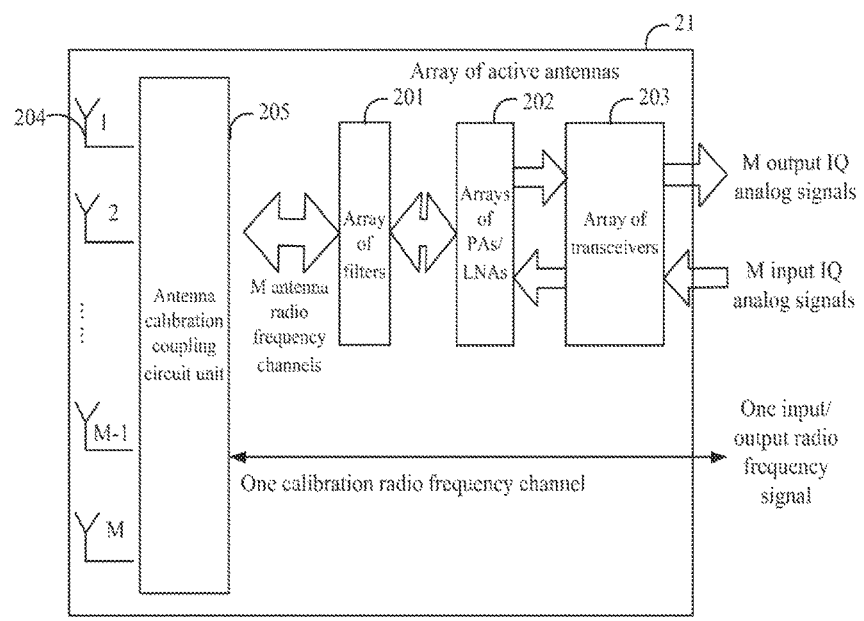
FIG. 2 is a schematic structural diagram of an array of active antennas according to an embodiment of the invention.

In a first embodiment of the invention, there is provided an array of active antennas 21 as illustrated in FIG. 2 including an array of filters 201, an array of PAs and LNAs 202, and an array of transceivers 203, which are connected sequentially, and M antenna dipoles 204, where M is more than 1, the M antenna dipoles 204 are connected with an antenna calibration coupling circuit unit 205, and the antenna calibration coupling circuit unit 205 is connected with the array of filters 201, and further with one calibration radio frequency channel.

Here the M antenna dipoles 204 are configured to receive and convert an electromagnetic wave into M radio frequency signals, or to receive and convert M radio frequency signals into an electromagnetic wave, and then transmit the electromagnetic wave;

The antenna calibration coupling circuit unit 205 is configured to transmit the radio frequency signals between the array of filters 201 and the M antenna dipoles 204 while the radio frequency signals are being transmitted; and to couple M calibration radio frequency signals transmitted by the array of filters 201 into one calibration radio frequency signal, and to output the calibration radio frequency signal over the calibration radio frequency channel; or to receive one calibration radio frequency signal over the calibration radio frequency channel, to split the received calibration radio frequency signal into M calibration radio frequency signals, and to transmit the M calibration radio frequency signals to the array of filters 201, while the received or transmitted signals are being calibrated;

The array of filters 201 is configured to filter the M radio frequency signals;

The array of PAs and LNAs 202 is configured to amplify power of the M radio frequency signals; and The array of transceivers 203 is configured to convert the M radio frequency signals into M IQ analog signals, and to transmit the M IQ analog signals; or to convert received M IQ analog signals into the radio frequency signals.

In a particular implementation, the array of filters 201 includes M filters independent of each other.

In a particular implementation, the array of PAs and LNAs 202 includes M power amplifier independent of each other, and M low-noise amplifiers independent of each other.

In a particular implementation, the array of transceivers 203 includes M transceiver units.

In a particular implementation, the antenna dipoles 204 can be uni-polarized antenna dipoles, or can be duly-polarized antenna dipoles or multi-polarized antenna dipoles.

Particularly while the signals are being transmitted, the array of transceivers modulates and up-converts input M IQ analog signals into M radio frequency signals; the power of the M radio frequency signals is amplified by the array of PAs and LNAs, and the M radio frequency signals are filtered by the array of filters into M radio frequency signals with a corresponding spectrum; and the M radio frequency signals with the corresponding spectrum are transmitted by the antenna calibration coupling circuit unit to the M antenna dipoles, and converted by the M antenna dipoles into the electromagnetic wave, and the electromagnetic wave is transmitted to the space.

Particularly while the signals are being received, the M antenna dipoles convert the received electromagnetic wave from the space into M radio frequency signals, and the M radio frequency signals are transmitted by the antenna calibration coupling circuit unit to the array of filters for radio frequency filtering into M radio frequency signals with a corresponding spectrum; the power of the M radio frequency signals with the corresponding spectrum is amplified by the array of PAs and LNAs and then the M radio frequency signals with the corresponding spectrum are output to the array of transceivers; and the array of transceivers down-converts and demodulates the M radio frequency signals from the array of PAs and LNAs into M IQ analog signals, and outputs the M IQ analog signals.

Particularly during transmission calibration over the antenna radio frequency channels, M transmission calibration IQ analog signals are input to the array of transceivers, and modulated and up-converted by the array of transceivers into M transmission calibration radio frequency signals; the power of the M transmission calibration radio frequency signals is amplified by the array of PAs and LNAs, and the M transmission calibration radio frequency signals are filtered by the array of filters into M transmission calibration radio frequency signals with a corresponding spectrum; and the M transmission calibration radio frequency signals with the corresponding spectrum are input to the antenna calibration coupling circuit unit, and coupled by the antenna calibration coupling circuit unit into one transmission calibration radio frequency signal, and the one transmission calibration radio frequency signal is output over the one calibration radio frequency channel.

Particularly during reception calibration over the antenna radio frequency channels, one reception calibration radio frequency signal is input to the antenna calibration coupling circuit unit, over the one calibration radio frequency channel, and split by the antenna calibration coupling circuit unit into M reception calibration radio frequency signals, and the M reception calibration radio frequency signals are output to the array of filters for radio frequency filtering into M reception calibration radio frequency signals with a corresponding spectrum; the power of the M reception calibration radio frequency signals with the corresponding spectrum is power-amplified by the array of PAs and LNAs, and then the power-amplified M reception calibration radio frequency signals with the corresponding spectrum are output to the array of transceivers; and the array of transceivers down-converts and demodulates the M reception calibration radio frequency signals with the corresponding spectrum from the array of PAs and LNA into M reception calibration IQ analog signals, and outputs the M reception calibration IQ analog signals.

Particularly in a particular implementation, if the system operates in non-antenna radio frequency channel calibration, then the antenna calibration coupling circuit unit will receive M radio frequency signals from the array of filters, and transmit the M radio frequency signals to the M antenna dipoles, while the signals are being transmitted; and the antenna calibration coupling circuit unit will receive radio frequency signals from the M antenna dipoles, and transmit the M radio frequency signals to the array of filters, while the signals are being received.

While the system operates in antenna radio frequency channel calibration, then the antenna calibration coupling circuit unit will receive M calibration radio frequency signals from the array of filters and couple the M calibration radio frequency signals to the one calibration radio frequency channel and output as one calibration radio frequency signal, during transmission calibration; and the antenna calibration coupling circuit unit will receive an input of a calibration radio frequency signal from the one calibration radio frequency channel, couple the input calibration radio frequency signal into M calibration radio frequency signals, and transmit the M calibration radio frequency signals to the array of filters, during reception calibration.

In a particular implementation, the array of filters performs radio frequency filtering on radio frequency signals, and controls the transmitted and received radio frequency signals to lie within certain range of frequencies to thereby alleviate inter-system interference. The array of filters performs radio filtering on the radio frequency signals from the array of PAs and LNAs, and transmit the filtered radio frequency signals to the antennal calibration coupling circuit unit, while the signals are being transmitted. The array of filters performs radio filtering on the radio frequency signals from the antennal calibration coupling circuit unit, and transmit the filtered radio frequency signals to the array of PAs and LNAs, while the signals are being received.

In a particular implementation, the array of PAs and LNAs amplifies the power of transmission (or reception) signals by amplifying the power of the M radio frequency signals from the array of transceivers, and inputting the power-amplified M radio frequency signals to the array of filters, while the signals are being transmitted; and amplifying the power of the M radio frequency signals from the array of filters, and inputting the power-amplified M radio frequency signals to the array of transceivers, while the signals are being received.

In a particular implementation, the array of transceivers modules and up-converts input M IQ analog signals into radio frequency signals, and outputs the radio frequency signals to the array of PAs and LNAs, while the signals are being transmitted; and down-converts and demodulates M radio frequency signals from the array of PAs and LNAs into M IQ analog signals while the signals are being received.

Figure 3:
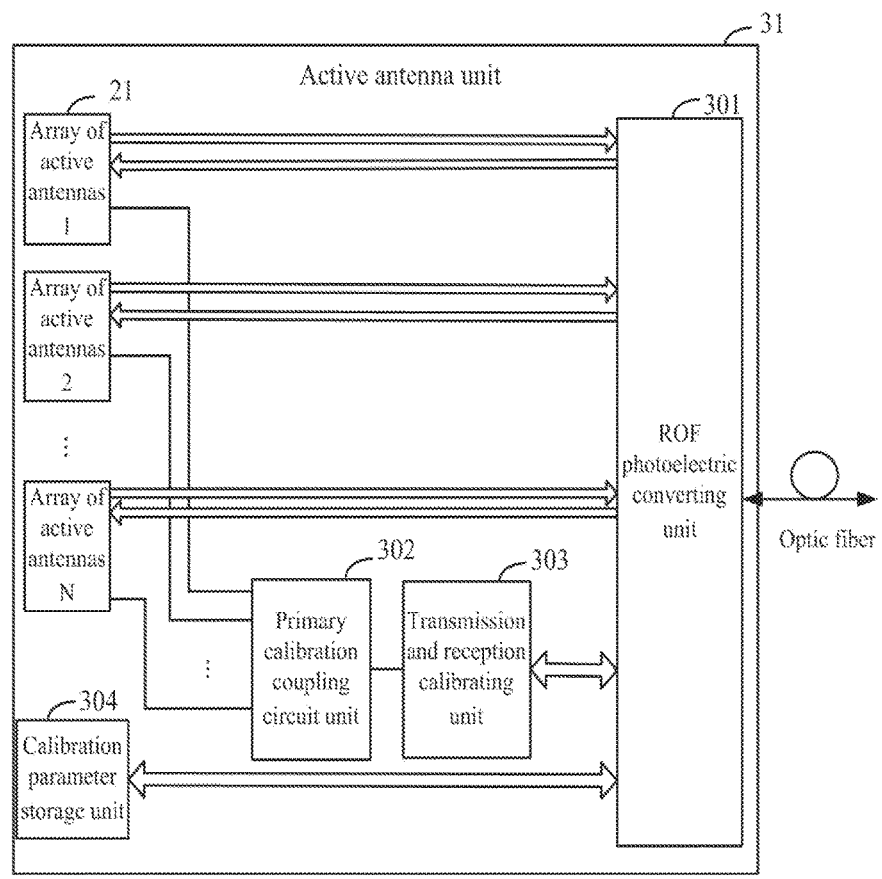
FIG. 3 is a schematic structural diagram of a massive active antenna device according to an embodiment of the invention.

In a second embodiment of the invention, there is provided an active antenna device 31 as illustrated in FIG. 3, where the massive active antenna unit includes an ROF photoelectric converting unit 301 and N arrays of active antennas 21, where N is more than 1, and the massive active antenna unit further includes a primary calibration coupling circuit unit 302 and a transmission and reception calibrating unit 303; and further includes a calibration parameter storage unit 304 connected with the ROF photoelectric converting unit 301.

Here reference can be made to the description of the first embodiment for a particular implementation of the arrays of active antennas 21, and particularly each array of active antennas 21 includes an array of filters 201, an array of PAs and LNAs 202, and an array of transceivers 203, which are connected sequentially, and M antenna dipoles 204, where M is more than 1, the M antenna dipoles 204 are connected with an antenna calibration coupling circuit unit 205, and the antenna calibration coupling circuit unit 205 is connected with the array of filters 201, and further with one calibration radio frequency channel.

Here the antenna calibration coupling circuit unit 205 of each array of active antennas 21 is connected with the primary calibration coupling circuit unit 302 over the calibration radio frequency channel, the primary calibration coupling circuit unit 302 is connected with the transmission and reception calibrating unit 303, and the transmission and reception calibrating unit 303 and the calibration parameter storage unit 304 are connected respectively with the ROF photoelectric converting unit 301.

Here the calibration parameter storage unit 304 is configured to store transmission parameters of the calibration radio frequency channels of the N arrays of active antennas 21, and to transmit the stored transmission parameters to the ROF photoelectric converting unit 301, so that the ROF photoelectric converting unit 301 converts the transmission parameters into an optical signal, and transmits the optical signal over an optic fiber.

In a particular implementation, the N arrays of active antennas can be configured in a planar array structure, a cylindrical structure, or any other possible structure.

Here the ROF photoelectric converting unit 301 and the arrays of active antennas 21 process signals being received, and signals being transmitted in different processes particularly as follows:

Firstly signals are received particularly as follows:

Each array of active antennas 21 converts a received electromagnetic wave into M radio frequency signals through the M antenna dipoles 204, and the antenna calibration coupling circuit unit 205 receives and transmits the M radio frequency signals to the array of filters 201, so that the M radio frequency signals are filtered by the array of filters 201, and then transmitted to the array of PAs and LNAs 202 for power amplification, and the power-amplified M radio frequency signals are converted by the array of transceivers 203 into M analog signals, and the M IQ analog signals are transmitted to the ROF photoelectric converting unit 301; and The ROF photoelectric converting unit 301 converts the N*M IQ analog signals transmitted by the N arrays of active antennas 21 into an optical signal, and transmits the optical signal over the optic fiber.

Secondly signals are transmitted particularly as follows:

The ROF photoelectric converting unit 301 converts an optical signal received over the optic fiber into N*M IQ analog signals, splits the N*M IQ analog signals into N groups, and transmits the N groups of IQ analog signals respectively to the N arrays of active antennas 21; and Each array of active antennas 21 converts the M IQ analog signals received through the array of transceivers 203 into M radio frequency signals; and then the power of the M radio frequency signals is amplified by the array of PAs and LNAs 202, and the power-amplified M radio frequency signals are filtered by the array of filters 201, and then the filtered M radio frequency signals are transmitted by the antenna calibration coupling circuit unit 205 respectively to the M antenna dipoles 204, and converted by the M antenna dipoles 204 into an electromagnetic wave which is further transmitted.

During calibration, there may be the following two processes of reception calibration and transmission calibration:

Firstly signals are processed during transmission calibration particularly as follows:

The antenna calibration coupling circuit unit 205 of each array of active arrays 21 couples received M calibration radio frequency signals into one transmission calibration radio frequency signal, and outputs the one transmission calibration radio frequency signal to the primary calibration coupling circuit unit 302 over the calibration radio frequency channel; the primary calibration coupling circuit unit 302 merges the N transmission calibration radio frequency signals transmitted by the N arrays of active arrays 21 into one transmission calibration radio frequency signal; the transmission and reception calibrating unit 303 amplifies the power of the one transmission calibration radio frequency signal transmitted by the primary calibration coupling circuit unit 302, and then demodulates the one transmission calibration radio frequency signal into a transmission calibration IQ analog signal, and outputs the transmission calibration IQ analog signal to the ROF photoelectric converting unit 301; and the ROF photoelectric converting unit 301 converts the transmission calibration IQ analog signal into an optical signal, and transmits the optical signal over the optic fiber.

Secondly signals are processed during reception calibration particularly as follows:

The transmission and reception calibrating unit 303 modulates a reception calibration IQ analog signal transmitted by the ROF photoelectric converting unit 301 into a reception calibration radio frequency signal, amplifies the power of the reception calibration radio frequency signal, and then transmits the power-amplified reception calibration radio frequency signal to the primary calibration coupling circuit unit 302; the primary calibration coupling circuit unit 302 splits the power-amplified reception calibration radio frequency signal into N duplicate reception calibration radio frequency signals, and transmits the N duplicate reception calibration radio frequency signals to the corresponding antenna calibration coupling circuit units 205 respectively over the calibration radio frequency channel corresponding to the N arrays of active antennas 21; and each antenna calibration coupling circuit unit 205 splits the received one reception calibration radio frequency signal into M reception calibration radio frequency signals.

In a particular implementation, the primary calibration coupling circuit unit 302 includes more than one merger-splitter, or more than one merger-splitter and coupler, or more than one switch matrix.

Figure 4:
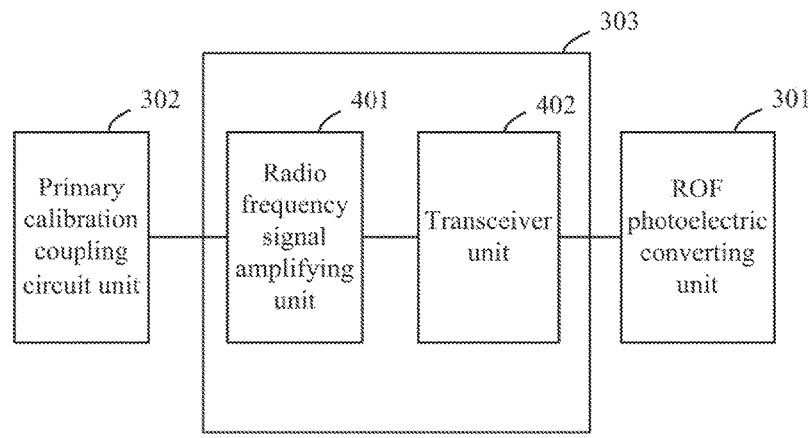
FIG. 4 is a schematic structural diagram of a transmission and reception calibrating unit according to an embodiment of the invention.

In a particular implementation, as illustrated in FIG. 4, the transmission and reception calibrating unit 303 includes a radio frequency signal amplifying unit 401 and a transceiver unit 402, both of which are connected with each other, and particularly the radio frequency signal amplifying unit 401 is connected with the primary calibration coupling circuit unit 302, and the transceiver unit 402 is connected with the ROF photoelectric converting unit 301. In the process of transmission calibration over antenna radio frequency channel, the transmission and reception calibrating unit amplifies the power of the one transmission calibration radio frequency signal from the primary calibration coupling circuit unit, down-converts and demodulates the one transmission calibration radio frequency signal into the transmission calibration IQ analog signal, and outputs the transmission calibration IQ analog signal to the ROF photoelectric converting unit. In the process of reception calibration over antenna radio frequency channel, the transmission and reception calibrating unit modulates and up-converts the reception calibration IQ analog signal from the ROF photoelectric converting unit into the reception calibrated radio frequency signal, amplifies the radio frequency power of the reception calibrated radio frequency signal, and outputs the power-amplified reception calibrated radio frequency signal to the primary calibration coupling circuit unit.

In a particular implementation, each array of filters 201 includes M filters independent of each other.

In a particular implementation, each array of PAs and LNAs 202 includes M power amplifiers independent of each other, and M low-noise amplifiers independent of each other.

In a particular implementation, each array of transceivers 203 includes M transceiver units.

Figure 5:
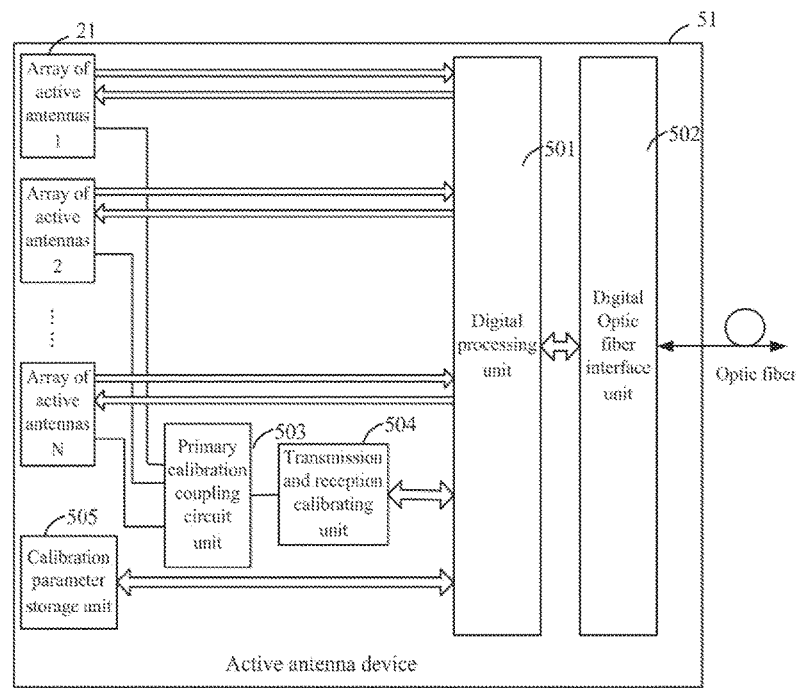
FIG. 5 is a schematic structural diagram of another massive active antenna device according to an embodiment of the invention.

In a third embodiment of the invention, there is provided an active antenna device 51 as illustrated in FIG. 5, where the massive active antenna device includes a digital processing unit 501, an optic fiber interface unit 502, a primary calibration coupling circuit unit 503, a transmission and reception calibrating unit 504, and N arrays of active antennas 21, where N s more than 1, where:

The N arrays of active antennas 21 are connected respectively with the digital processing unit 501, and the digital processing unit 501 is connected with the optic fiber interface unit 502; and The active antenna unit 51 further includes a calibration parameter storing unit 505 connected with the digital processing unit 501.

Here reference can be made to the description of the first embodiment for a particular implementation of the arrays of active antennas 21, and particularly each array of active antennas 21 includes an array of filters 201, an array of PAs and LNAs 202, and an array of transceivers 203, which are connected sequentially, and M antenna dipoles 204, where M is more than 1, the M antenna dipoles 204 are connected with an antenna calibration coupling circuit unit 205, and the antenna calibration coupling circuit unit 205 is connected with the array of filters 201, and further with one calibration radio frequency channel.

Here the antenna calibration coupling circuit unit 205 of each array of active antennas 21 is connected with the primary calibration coupling circuit unit 503 over the calibration radio frequency channel, the primary calibration coupling circuit unit 503 is connected with the transmission and reception calibrating unit 504, and the transmission and reception calibrating unit 504, and the calibration parameter storage unit 505 are connected respectively with the digital processing unit 501.

Here the calibration parameter storage unit 505 is configured to store transmission parameters of the calibration radio frequency channels of the N arrays of active antennas 21, and to transmit the transmission parameters to the digital processing unit 501.

In a particular implementation, the N arrays of active antennas can be configured in a planar array structure, a cylindrical structure, or any other possible structure.

Here signals being received, and signals being transmitted are processed in different processes particularly as follows:

Firstly signals are received particularly as follows:

Each array of active antennas 21 converts a received electromagnetic wave into M radio frequency signals through the M antenna dipoles 204, and transmits the M radio frequency signals to the array of filters 201 through the antenna calibration coupling circuit unit 205; the M radio frequency signals are filtered by the array of filters 201, and then transmitted to the array of PAs and LNAs 202 for power amplification; and the power-amplified NI radio frequency signals are converted by the array of transceivers 203 into M IQ analog signals and then the M IQ analog signals are transmitted to the digital processing unit 501;

The digital processing unit 501 converts the N*M IQ analog signals transmitted by the N arrays of active antennas 21 into N*M IQ digital signals; and The optic fiber interface unit 502 converts the N*M IQ digital signals transmitted by the digital processing unit 501 into an optical signal, and transmits the optical signal over the optic fiber.

Secondly signals are transmitted particularly as follows:

The optic fiber interface unit 502 converts an optical signal received over the optic fiber into N*M IQ digital signals;

The digital processing unit 501 converts the N*M IQ digital signals transmitted by the optic fiber interface unit 502 into N*M IQ analog signals, divides the N*M IQ analog signals into N groups, and transmits the N groups of IQ analog signals respectively to the N arrays of active antennas 21; and Each array of active antennas 21 converts the M IQ analog signals received through the array of transceivers 203 into M radio frequency signals; and then the power of the M radio frequency signals is amplified by the array of PAs and LNAs 202, and the power-amplified M radio frequency signals are filtered by the array of filters 201, and then the filtered M radio frequency signals are transmitted by the antenna calibration coupling circuit unit 205 respectively to the M antenna dipoles 204, and converted by the M antenna dipoles 204 into an electromagnetic wave which is further transmitted.

During calibration, there may be the following two processes of reception calibration and transmission calibration:

Firstly signals are processed during transmission calibration particularly as follows:

The antenna calibration coupling circuit unit of each array of active antennas couples received M calibration radio frequency signals into one transmission calibration radio frequency signal, and outputs the one transmission calibration radio frequency signal to the primary calibration coupling circuit unit over the calibration radio frequency channel; the primary calibration coupling circuit unit merges the N transmission calibration radio frequency signals transmitted by the N arrays of active antennas into one transmission calibration radio frequency signal; the transmission and reception calibrating unit amplifies the power of the one transmission calibration radio frequency signal transmitted by the primary calibration coupling circuit unit, and then demodulates the one transmission calibration radio frequency signal into a transmission calibration IQ analog signal, and outputs the transmission calibration IQ analog signal to the digital processing unit; and the digital processing unit converts the transmission calibration IQ analog signal into a transmission calibration IQ digital signal, and transmits the transmission calibration IQ digital signal through the optic fiber interface unit.

Particularly in the process of transmission calibration of antenna radio frequency, the N arrays of active antennas receive N*M transmission calibration IQ analog signals from the digital processing unit, converts the N*M transmission calibration IQ analog signals into N*M transmission calibration radio frequency signals, couples the N*M transmission calibration radio frequency signals into N transmission calibration radio frequency signals, and outputs the N transmission calibration radio frequency signals to the primary calibration coupling circuit unit.

Secondly signals are processed during reception calibration particularly as follows:

The digital processing unit converts a reception calibration IQ digital signal received through the optic fiber interface unit into a reception calibration IQ analog signal; the transmission and reception calibrating unit modulates the reception calibration IQ analog signal transmitted by the digital processing unit into a reception calibration radio frequency signal, amplifies the power of the reception calibration radio frequency signal, and then transmits the reception calibration radio frequency signal to the primary calibration coupling circuit unit; the primary calibration coupling circuit unit splits the power-amplified reception calibration radio frequency signal into N duplicate reception calibration radio frequency signals, and transmits the N duplicate reception calibration radio frequency signals to the corresponding antenna calibration coupling circuit units respectively over the calibration radio frequency channel corresponding to the N arrays of active antennas; and each antenna calibration coupling circuit unit splits the received one reception calibration radio frequency signal into M reception calibration radio frequency signals.

Particularly in the process of reception calibration over antenna radio frequency channel, the N arrays of active antennas receive N reception calibration radio frequency signals from the primary calibration coupling circuit unit, split the received N reception calibration radio frequency signals into N*M reception calibration radio frequency signals, convert the N*M reception calibration radio frequency signals into N*M reception calibration IQ analog signals, and output the N*M reception calibration IQ analog signals to the digital processing unit.

In a particular implementation, the primary calibration coupling circuit unit 503 includes more than one merger-splitter, or more than one merger-splitter and coupler, or more than one switch matrix.

In a particular implementation, like the previous embodiment, the transmission and reception calibrating unit 504 includes a radio frequency signal amplifying unit and a transceiver unit, both of which are connected with each other, and particularly the radio frequency signal amplifying unit is connected with the primary calibration coupling circuit unit 503, and the transceiver unit is connected with the digital processing unit 501. In the process of transmission calibration over antenna radio frequency channel, the transmission and reception calibrating unit amplifies the power of the one transmission calibration radio frequency signal from the primary calibration coupling circuit unit, down-converts and demodulates the one power-amplified transmission calibration radio frequency signal into the transmission calibration IQ analog signal, and outputs the transmission calibration IQ analog signal to the digital processing unit. In the process of reception calibration over antenna radio frequency channel, the transmission and reception calibrating unit modulates and up-converts the reception calibration IQ analog signal received from the digital processing unit into the reception calibrated radio frequency signal, amplifies the radio frequency power of the reception calibrated radio frequency signal, and outputs the power-amplified reception calibrated radio frequency signal to the primary calibration coupling circuit unit.

In a particular implementation, each array of filters 201 includes M filters independent of each other.

In a particular implementation, each array of PAs and LNAs 202 includes M power amplifier independent of each other, and M low-noise amplifiers independent of each other.

In a particular implementation, each array of transceivers 203 includes M transceiver units.

Figure 6:
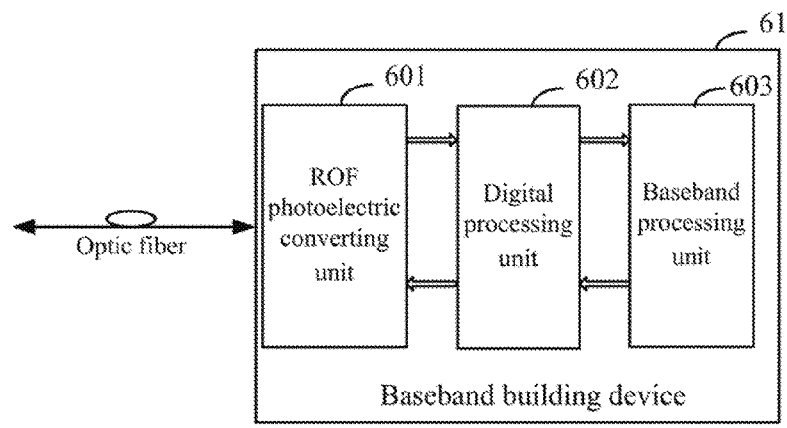
FIG. 6 is a schematic structural diagram of a massive baseband building device according to an embodiment of the invention.

In correspondence to the active antenna device 31 according to the second embodiment, there is provided in a fourth embodiment of the invention a baseband building device 61 as illustrated in FIG. 6 including an ROF photoelectric converting unit 601, a digital processing unit 602, and a baseband processing unit 603, which are connected sequentially.

Here signals being received, and signals being transmitted are processed in different processes particularly as follows:

Firstly signals are received particularly as follows:

The ROF photoelectric converting unit 601 converts a received optical signal into N*M IQ analog signals, where N is more than 1, and M is more than 1;

The digital processing unit 602 converts the N*M IQ analog signals received from the ROF photoelectric converting unit 601 into N*M IQ digital signals; and The baseband processing unit 603 performs data processing in the N*M IQ digital signals received from the digital processing unit 602 to obtain received data.

Secondly signals are transmitted particularly as follows:

The baseband processing unit 603 performs data process in the data to be transmitted and obtains N*M IQ digital signals;

The digital processing unit 602 converts the N*M IQ digital signals received from the baseband processing unit 603 into N*M IQ analog signals; and The ROF photoelectric converting unit 601 converts the N*M IQ analog signals received from the digital processing unit 602 into an optical signal, and transmits the optical signal over the optic fiber.

During calibration process, there may be the following two processes of reception calibration and transmission calibration:

Firstly signals are processed during reception calibration particularly as follows:

The baseband processing unit converts one preset reception calibration sequence into one reception calibration IQ digital signal, and transmits the one reception calibration IQ digital signal to the digital processing unit; and receives N*M reception calibration IQ digital signals, revises the N*M reception calibration IQ digital signals using N*M preset transmission parameters of calibration radio frequency channels, and calculates reception calibration amplitude revision parameters and reception calibration phase revision parameters corresponding to respective radio frequency channels corresponding to the calibration radio frequency channels according to the revised N*M reception calibration IQ digital signals, and the reception calibration sequence.

Here the received N*M reception calibration IQ digital signals are obtained as a result of the one reception calibration IQ digital signal being transmitted over the one calibration radio frequency channel and the N*M radio frequency channels of the active antenna device in that order, and then received over the optic fiber, and processed by the ROF photoelectric converting unit and the digital processing unit.

Here the N*M preset transmission parameters of the calibration radio frequency channel are received over the optic fiber, and then transmitted by the ROF photoelectric converting unit and the digital processing unit to the baseband processing unit.

Preferably the baseband processing unit 603 obtains uplink data, revises the amplitude of the uplink data using the reception calibration amplitude revision parameters, and revises the phase of the uplink data using the reception calibration phase revision parameters.

Here the uplink data are obtained as a result of an uplink signal being received over the optic fiber, and then transmitted by the ROF photoelectric converting unit 601 and the digital processing unit 602 to the baseband processing unit 603.

Secondly signals are processed during transmission calibration particularly as follows:

The baseband processing unit converts N*M preset transmission calibration sequences into N*M transmission calibration IQ digital signals, revises the N*M transmission calibration IQ digital signals of the corresponding calibration radio frequency channels using the N*M preset transmission parameters of the calibration radio frequency channels, and transmits the revised N*M transmission calibration IQ digital signals to the digital processing unit, and the digital processing unit converts the revised N*M transmission calibration IQ digital signals into N*M transmission calibration IQ analog signals, and then the ROF photoelectric converting unit converts the N*M transmission calibration IQ analog signals into an optical signal, and transmits the optical signal over the optic fiber; and the baseband processing unit receives one transmission calibration IQ digital signal, and calculates transmission calibration amplitude revision parameters and transmission calibration phase revision parameters of the respective radio channels corresponding to the calibration radio frequency channel according to the received one transmission calibration IQ digital signal, and the N*M preset transmission calibration sequences.

Here the received one transmission calibration IQ digital signal is obtained as a result of the revised N*M transmission calibration IQ digital signals being transmitted over the N*M radio frequency channels and the one calibration radio frequency channel of the active antenna device in that order, and then received over the optic fiber, and processed by the ROF photoelectric converting unit and the digital processing unit.

Here the N*M preset transmission parameters of the calibration radio frequency channels are received over the optic fiber, and then transmitted by the ROF photoelectric converting unit and the digital processing unit to the baseband processing unit.

Preferably the baseband processing unit 603 performs beam-forming on data to be transmitted, revises the amplitude of the beam-formed data using the transmission calibration amplitude revision parameters, revises the phase of the beam-formed data using the transmission calibration phase revision parameters, and then transmits the data to the digital processing unit 602, and the data are processed by the digital processing unit 602 and the ROF photoelectric converting unit 601, and then transmitted over the optic fiber.

Particularly the baseband processing unit performs beam-forming, signal detection, calibration detection, calibration compensation, and other functions. The calibration detection function includes transmission calibration, reception calibration, etc. The calibration compensation function includes transmission calibration compensation and reception calibration compensation. During transmission, the baseband processing unit performs beam-forming and transmission calibration compensation on the data to be transmitted, and then generates and outputs N*M IQ digital signals to the digital processing unit. During reception, the baseband processing unit performs reception calibration compensation on N*M IQ digital signals from the digital processing unit, and then performs signal detection thereon to obtain received data.

Figure 7:
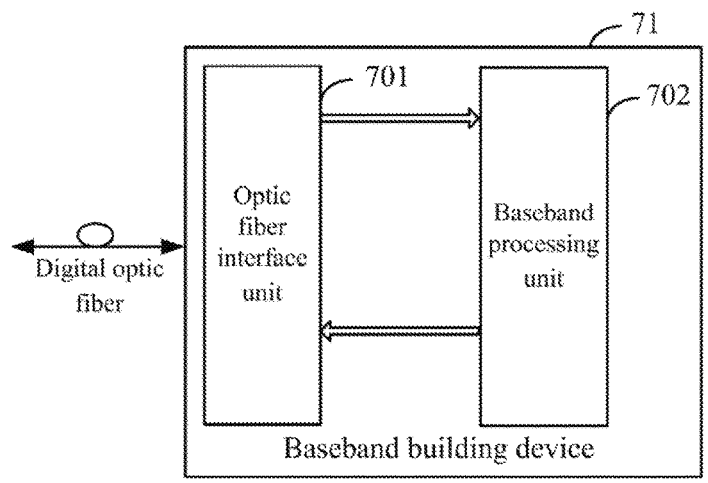
FIG. 7 is a schematic structural diagram of another massive baseband building device according to an embodiment of the invention.

In correspondence to the active antenna unit 51 according to the third embodiment, there is provided in a fifth embodiment of the invention a baseband building device 71 as illustrated in FIG. 7, where the massive baseband building device 71 includes an optic fiber interface unit 701 and a baseband processing unit 702, both of which are connected with each other.

Here signals being received, and signals being transmitted are processed in different processes particularly as follows:

Firstly signals are received particularly as follows:

The optic fiber interface unit 701 converts a received optical signal into N*M IQ digital signals, where N is more than 1, and M is more than 1; and The baseband processing unit 702 performs data processing on the N*M IQ digital signals received from the optic fiber interface unit 701 to obtain receive data.

Secondly signals are transmitted particularly as follows:

The baseband processing unit 702 processes data to be transmitted into N*M IQ digital signals; and The optic fiber interface unit 701 converts the N*M IQ digital signals received from the baseband processing unit 702 into an optical signal, and transmits the optical signal over the optic fiber.

During calibration, there may be the following two processes of reception calibration and transmission calibration:

Firstly signals are processed during reception calibration particularly as follows:

The baseband processing unit converts one preset reception calibration sequence into one reception calibration IQ digital signal, and transmits the one reception calibration IQ digital signal to the optic fiber interface unit, and the optic fiber interface unit transmits the one reception calibration IQ digital signal over the optic fiber; and the baseband processing unit receives N*M reception calibration IQ digital signals transmitted by the optic fiber interface unit, revises the N*M reception calibration IQ digital signals using N*M preset transmission parameters of calibration radio frequency channels, and calculates reception calibration amplitude revision parameters and reception calibration phase revision parameters corresponding to respective radio frequency channels corresponding to the calibration radio frequency channels according to the revised N*M reception calibration IQ digital signals, and the reception calibration sequence.

Here the received N*M reception calibration IQ digital signals are obtained as a result of the one reception calibration IQ digital signal being transmitted over the one calibration radio frequency channel and the N*M radio frequency channels of the active antenna device in that order, and then received over the optic fiber, and processed by the optic fiber interface unit.

Here the N*M preset transmission parameters of the calibration radio frequency channels are received over the optic fiber, and then transmitted by the optic fiber interface unit to the baseband processing unit.

Preferably the baseband processing unit 702 obtains uplink data, revises the amplitude of the uplink data using the reception calibration amplitude revision parameters, and revises the phase of the uplink data using the reception calibration phase revision parameters.

Here the uplink data are obtained as a result of an uplink signal being received over the optic fiber, and then transmitted by the optic fiber interface unit 701 to the baseband processing unit 702.

Secondly signals are processed during transmission calibration particularly as follows:

The baseband processing unit converts N*M preset transmission calibration sequences into N*M transmission calibration IQ digital signals, revises the N*M transmission calibration IQ digital signals of the corresponding calibration radio frequency channels using the N*M preset transmission parameters of the calibration radio frequency channels, and transmits the revised N*M transmission calibration IQ digital signals to the optic fiber interface unit, and the optic fiber interface unit converts the revised N*M transmission calibration IQ digital signals into an optical signal, and transmits the optical signal over the optic fiber; and the baseband processing unit receives one transmission calibration IQ digital signal transmitted by the optic fiber interface unit, and calculates transmission calibration amplitude revision parameters and transmission calibration phase revision parameters of the respective radio channels corresponding to the calibration radio frequency channels according to the received one transmission calibration IQ digital signal, and the N*M preset transmission calibration sequences.

Here the received one transmission calibration IQ digital signal is obtained as a result of the revised N*M transmission calibration IQ digital signals being transmitted over the N*M radio frequency channels and the one calibration radio frequency channel of the active antenna device in that order, and then received over the optic fiber, and processed by the optic fiber interface unit.

Here the N*M preset transmission parameters of the calibration radio frequency channels are received over the optic fiber, and then transmitted by the optic fiber interface unit to the baseband processing unit.

Preferably the baseband processing unit 702 performs beam-forming on data to be transmitted, revises the amplitude of the beam-formed data using the transmission calibration amplitude revision parameters, revises the phase of the beam-formed data using the transmission calibration phase revision parameters, and then transmits the data to the optic fiber interface unit 701, and the data are processed by the optic fiber interface unit 701, and then transmitted over the optic fiber.

Particularly the baseband processing unit performs beam-forming, signal detection, calibration detection, calibration compensation, and other functions. The calibration detection function includes transmission calibration, reception calibration, etc. The calibration compensation function includes transmission calibration compensation and reception calibration compensation. During transmission, the baseband processing unit performs beam-forming and transmission calibration compensation on the data to be transmitted, and then generates and outputs N*M IQ digital signals to the optic fiber interface unit. During reception, the baseband processing unit performs reception calibration compensation on N*M IQ digital signals from the optic fiber interface unit, and then performs signal detection thereon to obtain received data.

Figure 8:
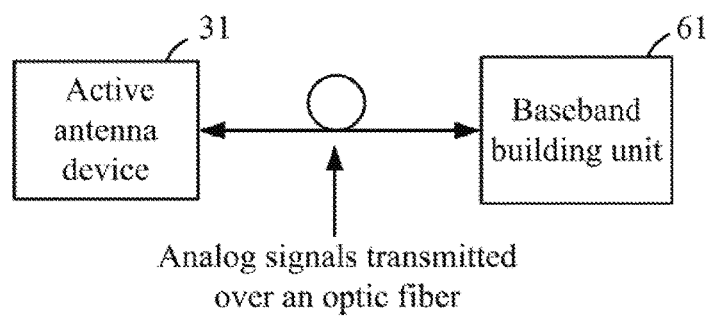
FIG. 8 is a schematic architectural diagram of a communication system according to an embodiment of the invention.

In a sixth embodiment of the invention, there is further provided a communication system as illustrated in FIG. 8 including the massive Active Antenna Unit (AAU) 31 according to the second embodiment, and the massive Baseband building Unit (BBU) 61 according to the fourth embodiment;

Here the active antenna unit 31 is connected with the baseband building unit 61.

In this embodiment, reference can be made to the description of the second embodiment above for a particular structure of the active antenna unit 31.

In this embodiment, reference can be made to the description of the fourth embodiment above for a particular structure of the baseband building unit 61.

Figure 9:
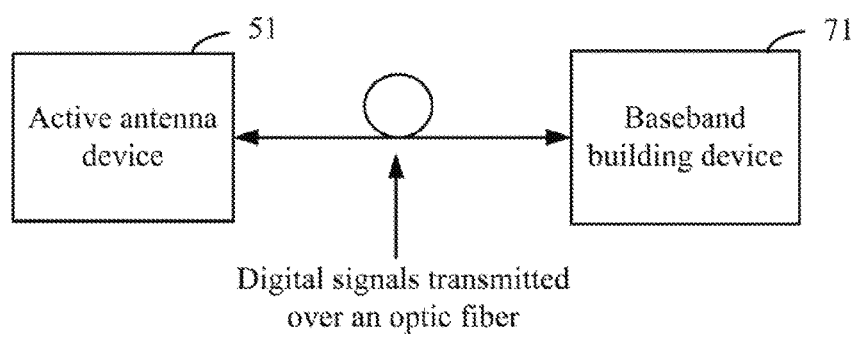
FIG. 9 is a schematic architectural diagram of another communication system according to an embodiment of the invention.

In a seventh embodiment of the invention, there is further provided another communication system as illustrated in FIG. 9 including the massive Active Antenna Unit (AAU) 51 according to the third embodiment, and the massive Baseband building Unit (BBU) 61 according to the fifth embodiment;

Here the active antenna unit 51 is connected with the baseband building unit 71.

In this embodiment, reference can be made to the description of the third embodiment above for a particular structure of the active antenna unit 51.

In this embodiment, reference can be made to the description of the fifth embodiment above for a particular structure of the baseband building unit 71.

Based upon the same inventive idea, in an eighth embodiment of the invention, there is further provided a reception calibrating method for reception calibration on respective antenna radio frequency channels particularly as follows:

A baseband building unit converts one preset reception calibration sequence into one reception calibration IQ digital signal, and transmits the one reception calibration IQ digital signal to an active antenna unit, and the active antenna unit transmits the one reception calibration IQ digital signal over one calibration radio frequency channel and N*M radio frequency channels in that order, and then obtains N*M reception calibration IQ digital signals; and The baseband building unit receives the N*M reception calibration IQ digital signals, revises the N*M reception calibration IQ digital signals using N*M preset transmission parameters of the calibration radio frequency channels, and calculates reception calibration amplitude revision parameters and reception calibration phase revision parameters corresponding to the respective radio frequency channels corresponding to the calibration radio frequency channels according to the revised N*M reception calibration IQ digital signals, and the reception calibration sequence.

Here the N*M preset transmission parameters of the calibration radio frequency channels are pre-stored in the active antenna unit; and the baseband building unit retrieves the N*M preset transmission parameters of the calibration radio frequency channels from the active antenna unit.

Preferably the baseband building unit obtains uplink data, revises the amplitude of the uplink data using the reception calibration amplitude revision parameters, and revises the phase of the uplink data using the reception calibration phase revision parameters.

Figure 10:
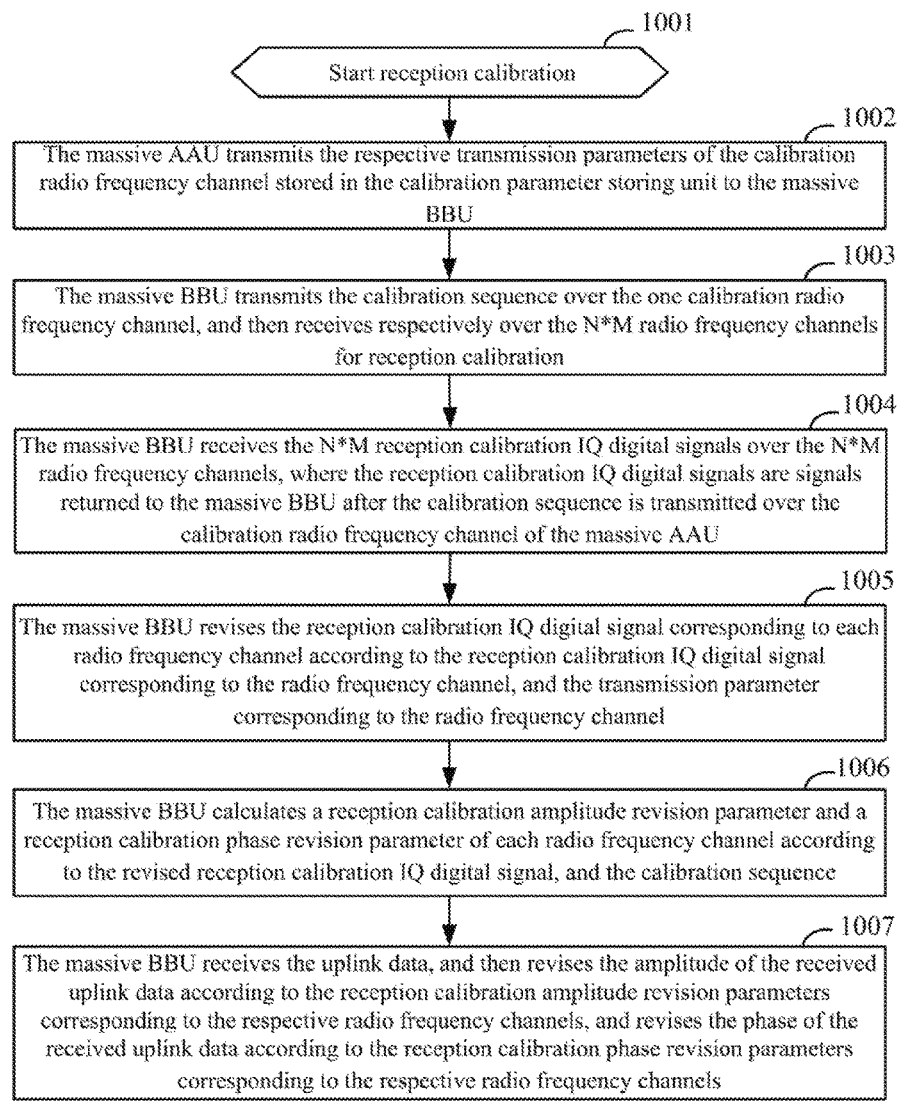
FIG. 10 is a schematic diagram of a reception calibrating process according to an embodiment of the invention.
Figure 11:
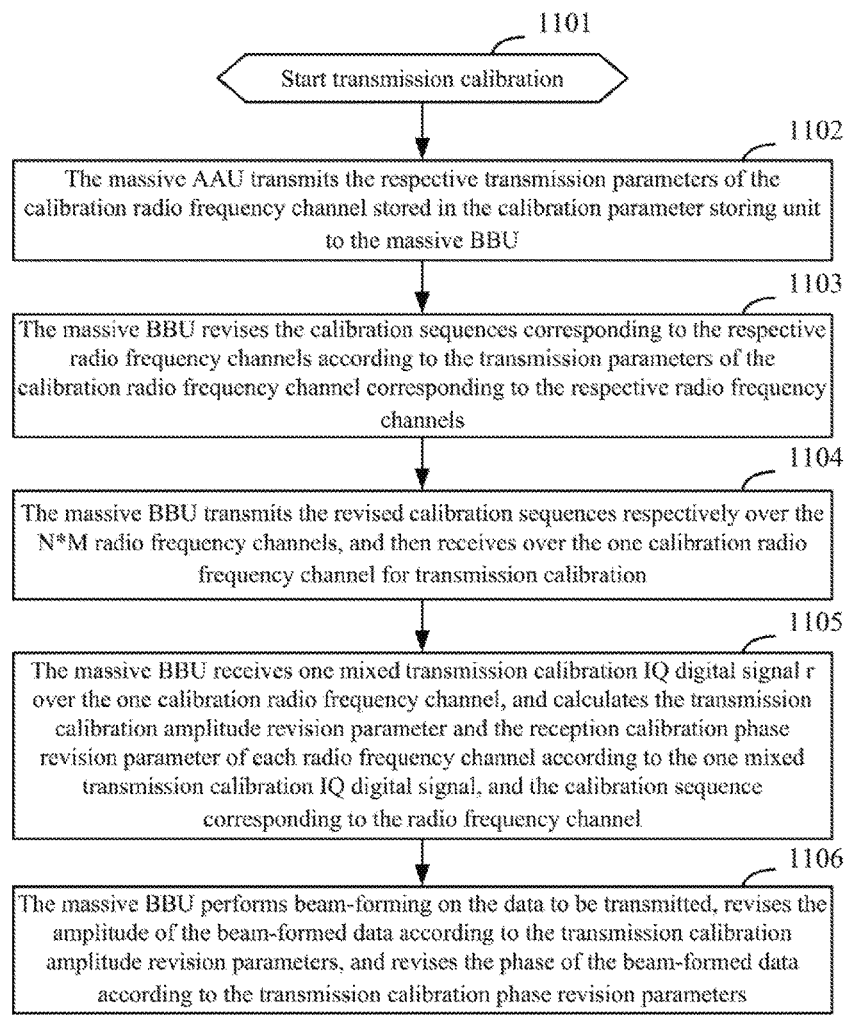
FIG. 11 is a schematic diagram of a transmission calibrating process according to an embodiment of the invention.

Based upon the communication system according to the sixth and seventh embodiments above, a particular reception calibration process as illustrated in FIG. 10 is as follows:

The step 1001 is to start reception calibration;

In the step 1002, the massive AAU transmits the respective transmission parameters of the calibration radio frequency channels stored in the calibration parameter storing unit to the massive BBU, where the transmission parameters can be represented as $S_i$, i=1, . . . , NM;

In the step 1003, the massive BBU transmits the calibration sequence c over the one calibration radio frequency channel, and then receives respectively over the N*M radio frequency channels for reception calibration;

In the step 1004, the massive BBU receives the N*M reception calibration IQ digital signals $r_i$, i=1, . . . , NM over the N*M radio frequency channels, where the reception calibration IQ digital signals are signals returned to the massive BBU after the calibration sequence c is transmitted over the calibration radio frequency channel of the massive AAU;

In the step 1005, the massive BBU revises the reception calibration IQ digital signal corresponding to the i-th radio frequency channel into $r_i/s_i$ according to the reception calibration IQ digital signal corresponding to the i-th radio frequency channel, and the transmission parameter corresponding to the i-th radio frequency channel;

In the step 1006, the massive BBU calculates a reception calibration amplitude revision parameter and a reception calibration phase revision parameter of each radio frequency channel according to the revised reception calibration IQ digital signal, and the calibration sequence; and In the step 1007, the massive BBU receives the uplink data, and then revises the amplitude of the received uplink data according to the reception calibration amplitude revision parameters corresponding to the respective radio frequency channels, and revises the phase of the received uplink data according to the reception calibration phase revision parameters corresponding to the respective radio frequency channels to thereby ensure the amplitude and the phase to be uniform at the respective antenna dipole interfaces.

Based upon the same inventive idea, in a ninth embodiment of the invention, there is further provided a transmission calibrating method for transmission calibration on respective antenna radio frequency channels particularly as follows:

A baseband building unit converts N*M preset transmission calibration sequences into N*M transmission calibration IQ digital signals, revises the N*M transmission calibration IQ digital signals of corresponding calibration radio frequency channels using N*M preset transmission parameters of the calibration radio frequency channels, and transmits the revised N*M transmission calibration IQ digital signals to an active antenna unit, and the active antenna unit transmits the revised N*M transmission calibration IQ digital signals over N*M radio frequency channels and the one calibration radio frequency channel in that order, and then obtains one transmission calibration IQ digital signal; and The baseband processing unit receives the one transmission calibration IQ digital signal, and calculates transmission calibration amplitude revision parameters and transmission calibration phase revision parameters of the respective radio channels corresponding to the calibration radio frequency channels according to the received one transmission calibration IQ digital signal, and the N*M preset transmission calibration sequences.

Preferably the N*M preset transmission parameters of the calibration radio frequency channels are pre-stored in the active antenna unit; and The baseband processing unit retrieves the N*M preset transmission parameters of the calibration radio frequency channels from the active antenna unit.

Preferably the baseband processing unit performs beamforming on data to be transmitted, revises the amplitude of the beam-formed data using the transmission calibration amplitude revision parameters, revises the phase of the beam-formed data using the transmission calibration phase revision parameters, and then transmits the data to the active antenna unit.

Based upon the communication system according to the sixth and seventh embodiments above, a particular reception calibration process as illustrated in FIG. 10 is as follows:

The step 1101 to start transmission calibration;

In the step 1102, the massive AAU transmits the respective transmission parameters of the calibration radio frequency channels stored in the calibration parameter storing unit to the massive BBU, where the transmission parameters can be represented as $S_i$, i=1, . . . , NM;

In the step 1103, the massive BBU revises the calibration sequences $c_i$(i=1, . . . , NM) corresponding to the respective radio frequency channels to $c_i/s_i$ according to the transmission parameter of the calibration radio frequency channel corresponding to the respective radio frequency channel;

In the step 1104, the massive BBU transmits the revised calibration sequences $c_i/s_i$ respectively over the N*M radio frequency channels, and then receives over the one calibration radio frequency channel for transmission calibration;

In the step 1105, the massive BBU receives one mixed transmission calibration IQ digital signal r over the one calibration radio frequency channel, and calculates the transmission calibration amplitude revision parameter and the reception calibration phase revision parameter of each radio frequency channel according to the one mixed transmission calibration IQ digital signal, and the calibration sequence $c_i$ corresponding to the radio frequency channel; and In the step 1106, the massive BBU performs beamforming on the data to be transmitted, revises the amplitude of the beam-formed data according to the transmission calibration amplitude revision parameters, and revises the phase of the beam-formed data according to the transmission calibration phase revision parameters.

With the technical solutions above, in the embodiments of the invention, the antenna calibration coupling circuit unit, the calibration radio frequency channel, the primary calibration coupling circuit unit, the transmission and reception calibrating unit, and the calibration parameter storing unit are additionally arranged in the active antenna unit to thereby provide a hardware support for transmission and reception calibration, so that transmission and reception calibration on the respective radio frequency channels can be performed using the active antenna unit including the calibration radio frequency channel and the calibration circuit, and the extensible design of the antenna radio frequency channels can be carried out using the active antenna unit while guaranteeing uniform performance of the respective antenna radio frequency channels to thereby make it less difficult to engineer the array of antennas while guaranteeing the implementation reliability thereof.

Moreover with the transmission calibrating method according to the embodiments of the invention, the performance of transmission calibration can be avoided from being affected by the calibrated internal parameters of the network to thereby ensure the amplitude and the phase to be uniform at the respective antenna dipole interfaces.

With the reception calibrating method according to the embodiments of the invention, the performance of reception calibration can be avoided from being affected by the calibrated internal parameters of the network to thereby ensure the amplitude and the phase to be uniform at the respective antenna dipole interfaces.

Those skilled in the art shall appreciate that the embodiments of the invention can be embodied as a method, a system or a computer program product. Therefore the invention can be embodied in the form of an all-hardware embodiment, an all-software embodiment or an embodiment of software and hardware in combination. Furthermore the invention can be embodied in the form of a computer program product embodied in one or more computer useable storage mediums including but not limited to a disk memory, an optical memory, etc.)

in which computer useable program codes are contained.

The invention has been described in a flow chart and/or a block diagram of the method, the device (system) and the computer program product according to the embodiments of the invention. It shall be appreciated that respective flows and/or blocks in the flow chart and/or the block diagram and combinations of the flows and/or the blocks in the flow chart and/or the block diagram can be embodied in computer program instructions. These computer program instructions can be loaded onto a general-purpose computer, a specific-purpose computer, an embedded processor or a processor of another programmable data processing device to produce a machine so that the instructions executed on the computer or the processor of the other programmable data processing device create means for performing the functions specified in the flow(s) of the flow chart and/or the block(s) of the block diagram.

These computer program instructions can also be stored into a computer readable memory capable of directing the computer or the other programmable data processing device to operate in a specific manner so that the instructions stored in the computer readable memory create an article of manufacture including instruction means which perform the functions specified in the flow(s) of the flow chart and/or the block(s) of the block diagram.

These computer program instructions can also be loaded onto the computer or the other programmable data processing device so that a series of operational steps are performed on the computer or the other programmable data processing device to create a computer implemented process so that the instructions executed on the computer or the other programmable device provide steps for performing the functions specified in the flow(s) of the flow chart and/or the block(s) of the block diagram.

Although the preferred embodiments of the invention have been described, those skilled in the art benefiting from the underlying inventive concept can make additional modifications and variations to these embodiments. Therefore the appended claims are intended to be construed as encompassing the preferred embodiments and all the modifications and variations coming into the scope of the invention.

Evidently those skilled in the art can make various modifications and variations to the invention without departing from the spirit and scope of the invention. Thus the invention is also intended to encompass these modifications and variations thereto so long as the modifications and variations come into the scope of the claims appended to the invention and their equivalents.

The invention claimed is:

1. An active antenna device, comprising:
N arrays of active antennas, a primary calibration coupling circuit unit, a transmission and reception calibrating unit, a calibration parameter storage unit, and a Radio Over Fiber (ROF) photoelectric converting unit, wherein N is an integer more than 1;
each of the N arrays of active antennas comprises at least an antenna calibration coupling circuit unit, and M antenna dipoles connected with the antenna calibration coupling circuit unit, wherein M is an integer more than 1;
the antenna calibration coupling circuit units of the N arrays of active antennas are connected with the primary calibration coupling circuit unit over a calibration radio frequency channel, the primary calibration coupling circuit unit is connected with the transmission and reception calibrating unit, and the transmission and reception calibrating unit and the calibration parameter storage unit are connected respectively with the ROF photoelectric converting unit;
the calibration parameter storage unit stores transmission parameters of the calibration radio frequency channels of the N arrays of active antennas, and transmits the transmission parameters to the ROF photoelectric converting unit, so that the ROF photoelectric converting unit converts the transmission parameters into a first optical signal, and transmits the first optical signal over an optic fiber; and
the antenna calibration coupling circuit unit of each of the N arrays of active antennas couples received M transmission calibration radio frequency signals into one transmission calibration radio frequency signal, and outputs the one transmission calibration radio frequency signal to the primary calibration coupling circuit unit over the calibration radio frequency channel;
the primary calibration coupling circuit unit merges N transmission calibration radio frequency signals transmitted by the N arrays of active arrays into one transmission calibration radio frequency signal; the transmission and reception calibrating unit amplifies the power of the one transmission calibration radio frequency signal transmitted by the primary calibration coupling circuit unit, and then demodulates the one transmission calibration radio frequency signal into a transmission calibration IQ analog signal, and outputs the transmission calibration IQ analog signal to the ROF photoelectric converting unit; and the ROF photoelectric converting unit converts the transmission calibration IQ analog signal into a second optical signal, and transmits the second optical signal over the optic fiber; and/or the transmission and reception calibrating unit modulates a reception calibration IQ analog signal transmitted by the ROF photoelectric converting unit into a reception calibration radio frequency signal, amplifies the power of the reception calibration radio frequency signal, and then transmits the power-amplified reception calibration radio frequency signal to the primary calibration coupling circuit unit; the primary calibration coupling circuit unit splits the power-amplified reception calibration radio frequency signal into N duplicate reception calibration radio frequency signals, and transmits the N duplicate reception calibration radio frequency signals to the corresponding antenna calibration coupling circuit units respectively over the calibration radio frequency channel corresponding to the N arrays of active antennas; and each antenna calibration coupling circuit unit splits the received one reception calibration radio frequency signal into M reception calibration radio frequency signals.

2. The active antenna device according to claim 1, wherein each array of active antennas further comprises:
an array of filters, an array of Power Amplifiers (PAs) and Low-Noise Amplifiers (LNAs), and an array of transceivers, which are connected sequentially, wherein the array of filters is connected with the antenna calibration coupling circuit unit, and the array of transceivers is connected with the ROF photoelectric converting unit;
the array of filters is configured to filter the M transmission calibration radio frequency signals or the M reception calibration radio frequency signals;
the array of PAs and LNAs is configured to amplify the power of the M transmission calibration radio frequency signals or the M reception calibration radio frequency signals; and
the array of transceivers is configured to convert the M transmission calibration radio frequency signals or the M reception calibration radio frequency signals into M IQ analog signals, and to transmit the M IQ analog signals; or to convert received M IQ analog signals into the M transmission calibration radio frequency signals or the M reception calibration radio frequency signals.

3. The active antenna device according to claim 2, wherein the transmission and reception calibrating unit comprises a radio frequency signal amplifying unit and a transceiver unit, both of which are connected with each other, wherein:
the radio frequency signal amplifying unit is connected with the primary calibration coupling circuit unit, and the transceiver unit is connected with the ROF photoelectric converting unit.

4. The active antenna device according to claim 2, wherein each array of filters comprises M filters independent of each other.

5. The active antenna device according to claim 2, wherein each array of PAs and LNAs comprises:
M power amplifiers independent of each other, and M low-noise amplifiers independent of each other.

6. The active antenna device according to claim 2, wherein each array of transceivers comprises M transceiver units.

7. The active antenna device according to claim 1, wherein the primary calibration coupling circuit unit comprises:

more than one merger-splitter; or
more than one merger-splitter and coupler; or
more than one switch matrix.

8. An active antenna device, comprising:
N arrays of active antennas, a primary calibration coupling circuit unit, a transmission and reception calibrating unit, a calibration parameter storage unit, a digital processing unit, and an optic fiber interface unit, wherein N is an integer more than 1;
each of the N arrays of active antennas comprises at least an antenna calibration coupling circuit unit, and M antenna dipoles connected with the antenna calibration coupling circuit unit, wherein M is an integer more than 1;
the antenna calibration coupling circuit units of the N arrays of active antennas are connected with the primary calibration coupling circuit unit over a calibration radio frequency channel, the primary calibration coupling circuit unit is connected with the transmission and reception calibrating unit, and the transmission and reception calibrating unit and the calibration parameter storage unit are connected respectively with the digital processing unit;
the calibration parameter storage unit stores transmission parameters of the calibration radio frequency channel of the N arrays of active antennas, and transmits the transmission parameters to the digital processing unit; and
the antenna calibration coupling circuit unit of each of the N arrays of active antennas couples received M transmission calibration radio frequency signals into one transmission calibration radio frequency signal, and outputs the one transmission calibration radio frequency signal to the primary calibration coupling circuit unit over the calibration radio frequency channel; the primary calibration coupling circuit unit merges N transmission calibration radio frequency signals transmitted by the N arrays of active arrays into one transmission calibration radio frequency signal; the transmission and reception calibrating unit amplifies the power of the one transmission calibration radio frequency signal transmitted by the primary calibration coupling circuit unit, and then demodulates the one transmission calibration radio frequency signal into a transmission calibration IQ analog signal, and outputs the transmission calibration IQ analog signal to the digital processing unit; and the digital processing unit converts the transmission calibration IQ analog signal into a transmission calibration IQ digital signal, and transmits the transmission calibration IQ digital signal through the optic fiber interface unit; and/or the digital processing unit converts a reception calibration IQ digital signal received by the optic fiber interface unit into a reception calibration IQ analog signal; the transmission and reception calibrating unit modulates the reception calibration IQ analog signal transmitted by the digital processing unit into a reception calibration radio frequency signal, amplifies the power of the reception calibration radio frequency signal, and then transmits the power-amplified reception calibration radio frequency signal to the primary calibration coupling circuit unit; the primary calibration coupling circuit unit splits the power-amplified reception calibration radio frequency signal into N duplicate reception calibration radio frequency signals, and transmits the N duplicate reception calibration radio frequency signals to the corresponding antenna calibration coupling circuit units respectively over the calibration radio frequency channel corresponding to the N arrays of active antennas; and each antenna calibration coupling circuit unit splits the received one reception calibration radio frequency signal into M reception calibration radio frequency signals.

9. The active antenna device according to claim 8, wherein each array of active antennas further comprises:
an array of filters, an array of Power Amplifiers (PAs) and Low-Noise Amplifiers (LNAs), and an array of transceivers, which are connected sequentially, wherein the array of filters is connected with the antenna calibration coupling circuit unit, and the array of transceivers is connected with the digital processing unit;
the array of filters is configured to filter the M transmission calibration radio frequency signals or the M reception calibration radio frequency signals;
the array of PAs and LNAs is configured to amplify the power of the M transmission calibration radio frequency signals or the M reception calibration radio frequency signals; and
the array of transceivers is configured to convert the M transmission calibration radio frequency signals or the M reception calibration radio frequency signals into M IQ analog signals, and to transmit the M IQ analog signals; or to convert received M IQ analog signals into the M transmission calibration radio frequency signals or the M reception calibration radio frequency signals.

10. The active antenna device according to claim 9, wherein the transmission and reception calibrating unit comprises a radio frequency signal amplifying unit and a transceiver unit, both of which are connected with each other, wherein:
the radio frequency signal amplifying unit is connected with the primary calibration coupling circuit unit, and the transceiver unit is connected with the digital processing unit.

11. The active antenna device according to claim 8, wherein the primary calibration coupling circuit unit comprises:
more than one merger-splitter; or
more than one merger-splitter and coupler; or
more than one switch matrix.

12. A transmission and reception calibrating method, comprising:
converting, by a baseband building device, one preset reception calibration sequence into one reception calibration IQ digital signal, and transmitting the one reception calibration IQ digital signal to an active antenna device, and transmitting, by the active antenna device, the one reception calibration IQ digital signal over one calibration radio frequency channel and N*M radio frequency channels in that order, and then obtaining, by the active antenna device, N*M reception calibration IQ digital signals; and receiving, by the baseband building device, the N*M reception calibration IQ digital signals, revising the N*M reception calibration IQ digital signals using N*M preset transmission parameters of the one calibration radio frequency channel, and calculating reception calibration amplitude revision parameters and reception calibration phase revision parameters of each of the radio frequency channels corresponding to the one calibration radio frequency channel according to the revised N*M reception calibration IQ digital signals, and the one preset reception calibration sequence;

and/or converting, by the baseband building device, N*M preset transmission calibration sequences into N*M transmission calibration IQ digital signals, revising the N*M transmission calibration IQ digital signals of a corresponding calibration radio frequency channel using the N*M preset transmission parameters of the corresponding calibration radio frequency channel, and transmitting the revised N*M transmission calibration IQ digital signals to the active antenna device, and transmitting, by the active antenna device, the revised N*M transmission calibration IQ digital signals over the N*M radio frequency channels and the one calibration radio frequency channel in that order, and then obtaining, by the active antenna device, one transmission calibration IQ digital signal; and receiving, by the baseband building device, the one transmission calibration IQ digital signal, and calculating transmission calibration amplitude revision parameters and transmission calibration phase revision parameters of each of radio frequency channels corresponding to the corresponding calibration radio frequency channel according to the received one transmission calibration IQ digital signal, and the N*M preset transmission calibration sequences;

wherein N and M are integers greater than 1.

13. The method according to claim 12, wherein the N*M preset transmission parameters of the corresponding calibration radio frequency channel are pre-stored in the active antenna device; and the baseband building device retrieves the N*M preset transmission parameters of the corresponding calibration radio frequency channel from the active antenna device.

14. The method according to claim 12, wherein the method further comprises:

obtaining, by the baseband building device, uplink data via an optic fiber, revising the amplitude of the uplink data using the reception calibration amplitude revision parameters, and revising the phase of the uplink data using the reception calibration phase revision parameters.

15. The method according to claim 12, wherein the method further comprises:

performing, by the baseband building device, beam-forming on data to be transmitted, revising the amplitude of the beam-formed data using the transmission calibration amplitude revision parameters, revising the phase of the beam-formed data using the transmission calibration phase revision parameters, and then transmitting the data to the active antenna device.

* * * * *